United States Patent
Mosalikanti et al.

(10) Patent No.: US 10,790,832 B2
(45) Date of Patent: Sep. 29, 2020

(54) APPARATUS TO IMPROVE LOCK TIME OF A FREQUENCY LOCKED LOOP

(71) Applicant: Intel Corporation, Santa Clara, CA (US)

(72) Inventors: Praveen Mosalikanti, Portland, OR (US); Qi Wang, Portland, OR (US); Mark L. Neidengard, Beaverton, OR (US); Vaughn J. Grossnickle, Beaverton, OR (US); Nasser A. Kurd, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 62 days.

(21) Appl. No.: 15/933,235

(22) Filed: Mar. 22, 2018

(65) Prior Publication Data

US 2019/0296747 A1 Sep. 26, 2019

(51) Int. Cl.
*H03K 3/03* (2006.01)
*H03L 1/00* (2006.01)
*H03L 7/099* (2006.01)
*H03L 7/08* (2006.01)

(52) U.S. Cl.
CPC ............ *H03L 7/08* (2013.01); *H03K 3/0315* (2013.01); *H03L 1/00* (2013.01); *H03L 7/0995* (2013.01); *H03B 2201/038* (2013.01)

(58) Field of Classification Search
CPC .. H03B 5/04; H03B 2201/038; H03K 3/0315; H03K 3/0322; H03L 1/00; H03L 7/0995
USPC .......................................................... 331/57
See application file for complete search history.

(56) References Cited

U.S. PATENT DOCUMENTS

| 5,416,444 A * | 5/1995 | Yamauchi | G01R 25/08 324/76.82 |
| 5,854,576 A * | 12/1998 | Swan | H03L 7/081 331/57 |
| 6,333,652 B1 * | 12/2001 | Iida | H03L 7/0805 327/161 |
| 7,064,620 B1 * | 6/2006 | Lai | H03K 3/0322 331/45 |
| 9,762,249 B1 | 9/2017 | Faisal et al. | |
| 10,355,701 B2 * | 7/2019 | Pandita | H03K 3/0315 |
| 2004/0150445 A1 | 8/2004 | Gomm et al. | |
| 2008/0069292 A1 * | 3/2008 | Straayer | G04F 10/005 377/46 |
| 2008/0284530 A1 | 11/2008 | Pellerano et al. | |
| 2010/0194442 A1 * | 8/2010 | Walley | H03K 19/0008 327/100 |

(Continued)

FOREIGN PATENT DOCUMENTS

JP 2006080903 3/2006

OTHER PUBLICATIONS

International Search Report & Written Opinion dated Jun. 7, 2019 for PCT Patent Application No. PCT/US19/18104.

*Primary Examiner* — Levi Gannon
(74) *Attorney, Agent, or Firm* — Green, Howard & Mughal, LLP

(57) ABSTRACT

An apparatus is provided which comprises: a frequency locked loop (FLL) comprising an oscillator including a plurality of delay stages, wherein an output of each delay stage is counted to determine a frequency of the FLL; and one or more circuitries coupled to the FLL to adjust a power supply to the FLL according to the determined frequency of the FLL.

26 Claims, 10 Drawing Sheets

(56) References Cited

U.S. PATENT DOCUMENTS

| | | | |
|---|---|---|---|
| 2010/0271140 A1* | 10/2010 | Raghunathan | H03L 7/099 331/34 |
| 2010/0301961 A1 | 12/2010 | Story et al. | |
| 2011/0316639 A1* | 12/2011 | Fischette | H03L 7/093 331/183 |
| 2015/0234400 A1* | 8/2015 | Takahashi | G05F 1/463 323/275 |
| 2016/0191026 A1* | 6/2016 | Li | H03B 5/00 331/57 |
| 2018/0076821 A1* | 3/2018 | Loke | H03L 7/0996 |
| 2019/0187628 A1* | 6/2019 | Chu | G04F 10/005 |

* cited by examiner

US 10,790,832 B2

APPARATUS TO IMPROVE LOCK TIME OF A FREQUENCY LOCKED LOOP

BACKGROUND

Digital phase locked loops (PLLs), delay locked loops (DLLs), and frequency locked loops (FLLs) currently rely on a combination of coarse and fine bands to achieve the frequency and/or delay range and resolution of interest. There is a calibration cost that range from several hundred nano-seconds to a couple of milliseconds based on the delay range and resolution requirements of a target frequency. The calibration is usually done during a phase or frequency lock process at a given temperature, and any frequency change due to temperature drift may need to be accounted for in a form of adequate fine code range, or in the form of risky alternatives like jumping coarse bands which would show up as undesirable jitter at the output of the PLL/DLL/FLL.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
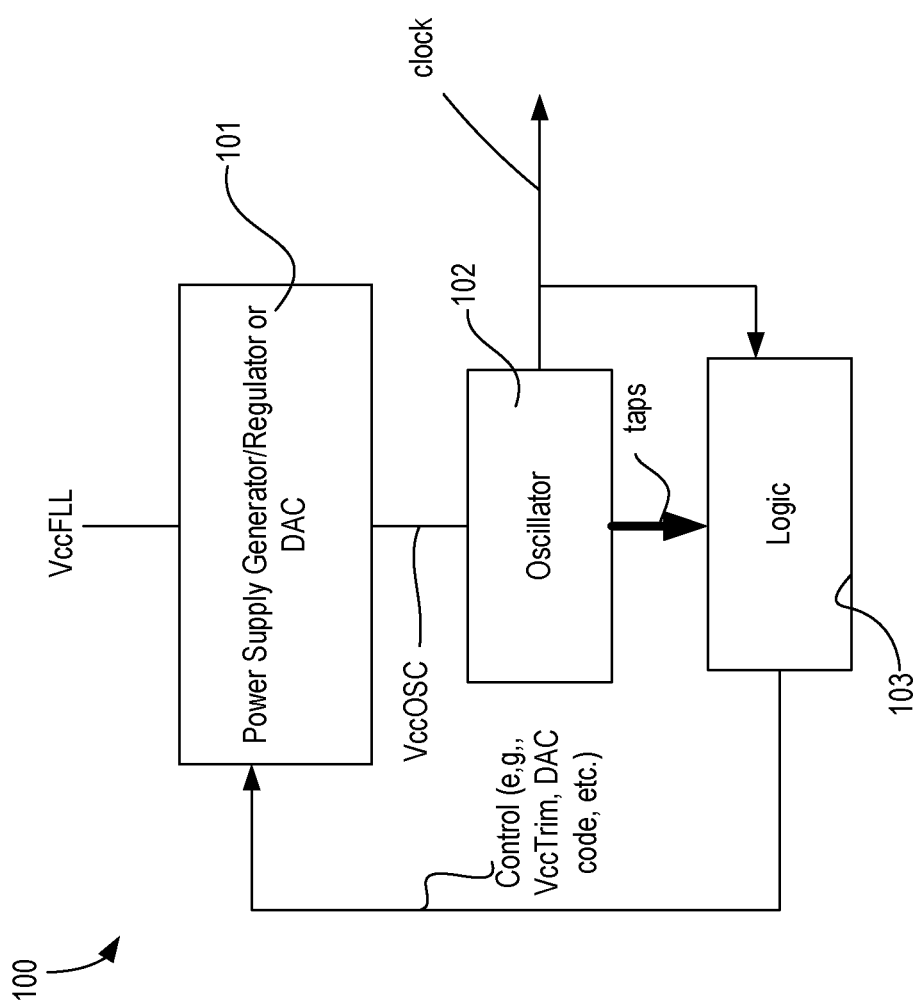
FIG. 1 illustrates a high level architecture of an apparatus to improve lock time of a frequency locked loop (FLL), according to some embodiments of the disclosure.

Some embodiments describe a fast voltage and frequency adjustment apparatus for a frequency locked loop, where the fast voltage and frequency adjustment apparatus applies a capacitor-less low dropout (LDO) regulator. In some embodiments, phase difference between multiple taps in a ring oscillator of the FLL are used to avoid synchronization penalty while providing an effective fine count resolution. For example, a count resolution of 0.1 resulting in +/−0.1 count error for a 5 stage ring oscillator is achieved by determining the frequency of the FLL using multiple taps in the ring oscillator. Here, the term "taps" generally refers to nodes corresponding to outputs of delay stages forming a ring oscillator. Some embodiments describe an apparatus that results in fast lock with high precision (e.g., 300 ns of lock time for 0.1% accuracy at 5 GHz) using multiple Gray code counters. The Gray code counters count both edges of the phase spaced clocks from the taps of the ring oscillator. The apparatus of various embodiments results in post calibration power reduction to create a clock source with low power (e.g., less than 400 µA of current consumption is observed at 3.2 GHz). The apparatus of various embodiments avoids the need for banding, and of having to account for temperature drift while improving frequency resolution and lock time significantly over current schemes that use banding and have longer lock times. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a high level architecture 100 of an apparatus to improve lock time of a frequency locked loop (FLL), according to some embodiments of the disclosure. In some embodiments, architecture 100 for fast FLL locking comprises a power supply generator, regulator, or digital-to-analog (DAC) converter 101 (hereinafter referred to as supply generator), oscillator 102, and logic 103.

In some embodiments, the supply generator is a power supply regulator that receives input supply VccFLL (e.g., approximately 1 V) and provides a regulated supply VccOSC to oscillator 102. In some embodiments, the power supply generator is a low dropout (LDO) regulator such as a digital LDO regulator. In some embodiments, the LDO is capacitor-less. For example, the traditional load capacitor added to the VccOSC rail is removed yet providing a stable and fast regulating power supply VccOSC on the VccOSC rail. In some embodiments, the power supply generator is a fully integrated voltage regulator (e.g., an on-die buck or boost DC-DC converter). In some embodiments, the power supply generator is a current controlled DAC that can increase or decrease or supply current and/or voltage to the VccOSC supply rail.

In some embodiments, oscillator 102 is a digitally controlled oscillator (e.g., DCO) having multiple adjustable delay stages that are coupled together in a ring formation. In some embodiments, oscillator 102 is a mixed signal controlled oscillator (e.g., an oscillator that is controlled by an analog voltage and digital codes) having multiple adjustable delay stages that are coupled together in a ring formation.

In some embodiments, logic 103 comprises counters, comparator(s), finite state machine (FSM), etc. to monitor the frequency of oscillator 102 by counting falling and rising edges of the signal through each delay stage of oscillator 102. For example, counters are coupled to outputs (also referred to as taps) of each delay stage of oscillator 102 and then an aggregate sum is computed to determine the frequency of oscillator 102. This scheme is much faster than determining the frequency of oscillator 102 using just the output clock of oscillator 102. As such, lock time or the time required for frequency calibration can be significantly improved over traditional schemes by tapping off from multiple locations within oscillator 102 or delay line and counting both the positive and negative edges at each tap-point. In a 5-stage ring oscillator, 5 taps can be used with 10 counters. This improves lock time by 10× iso-resolution or improves resolution 10× for a given lock time.

In some embodiments, logic 103 compares the frequency of oscillator 102 with a target or desired frequency and adjusts the supply VccOSC via a control signal to power supply generator 101 to achieve faster frequency lock. In some embodiments, the control signal is a digital code (e.g., two or more bits) to adjust the current strength of the DAC of power supply generator 101. In some embodiments, the control signal is a digital code to adjust the reference voltage (Vref) to the comparator of power supply generator 101.

Figure 7:
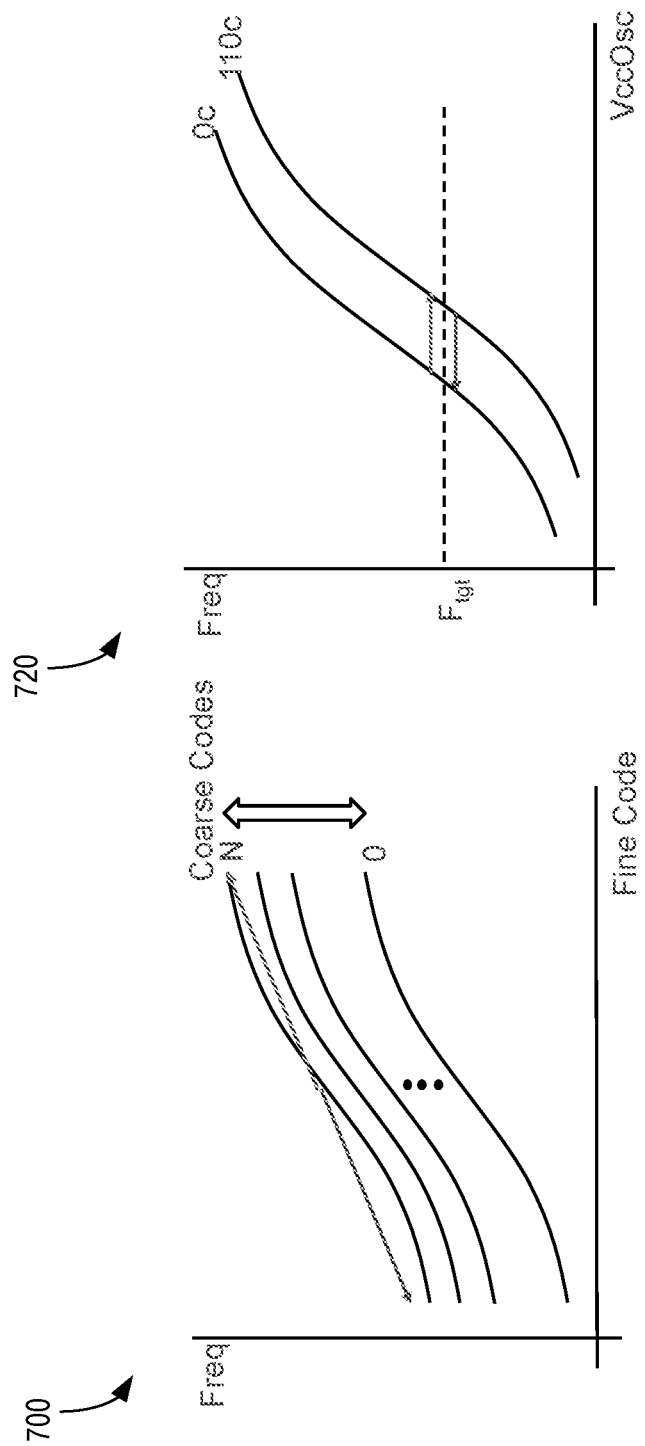
FIG. 7A illustrates a plot showing banding in existing all digital phase locked loops.
FIG. 7B illustrates a plot showing no banding using the apparatus of various embodiments.

With this approach of architecture 100 of various embodiments, temperature change may result in a change in VccOSC and may not require designing fine bands and factoring in the range of the fine band vs. expected drift due to temperature as in the case of existing all digital phase locked loops (ADPLL) as illustrated by FIGS. 7A-B.

FIG. 7A illustrates plot 700 showing banding in existing ADPLLs. Here, x-axis is the fine code from a digital filter of the ADPLL, while the y-axis is the frequency of oscillation at the output of the oscillator of the ADPLL, where the waveforms are separated by different coarse codes (0 through N). As temperature drifts, the fine code and coarse code may change to attain the desired frequency level. Changing the fine and coarse codes involves several iterations of feedback loops. FIG. 7B illustrates plot 720 showing no banding using the apparatus of various embodiments. Here, the x-axis is power supply level on VccOSC supply rail, and the y-axis is frequency of oscillation at the output of oscillator 102. By adjusting VccOSC to compensate for temperature drift (e.g., between 0 C and 110 C), the target frequency $F_{tgt}$ is quickly attained.

Figure 2:
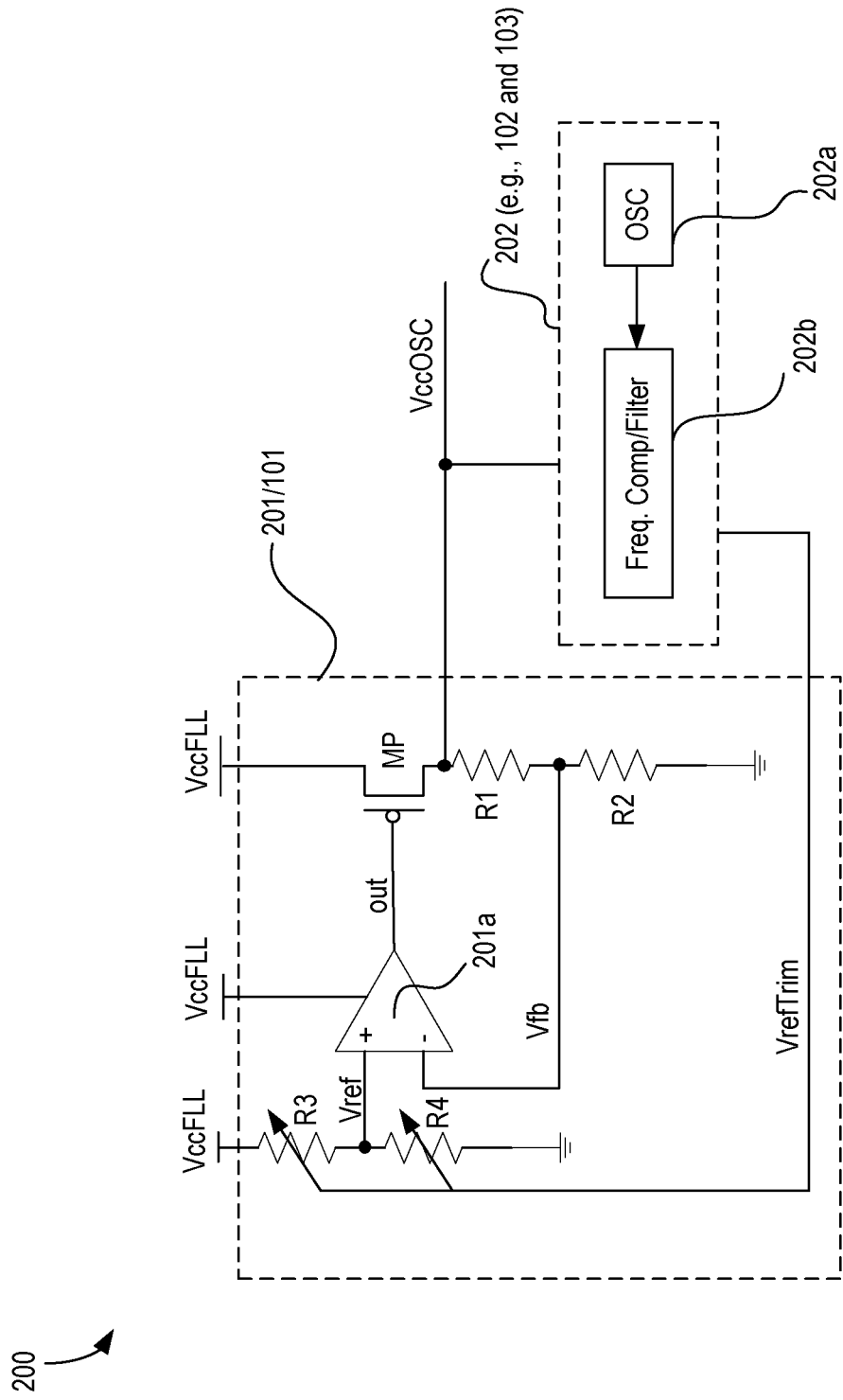
FIG. 2 illustrates an apparatus to improve lock time of a FLL, according to some embodiments of the disclosure.

FIG. 2 illustrates apparatus 200 to improve lock time of a FLL, according to some embodiments of the disclosure. Apparatus 200 comprises trimable or programmable LDO 201/101 as the power supply generator, and one or more circuitries 202 (e.g., 102 and 103). Here the term trimable generally refers to an ability or capability of a circuit to change its characteristics (e.g., drive strength, size, etc.) by adding or subtracting devices from the circuit. For example, a device can be trimmed to provide lower resistance or higher current drive by adding more devices in parallel to it.

In some embodiments, LDO 201/101 comprises comparator 201a, transistor MP (which may be a plurality of transistors coupled together in parallel), resistors R1 and R2 to scale the output supply voltage VccOSC, and trimable resistors R3 and R4 to adjust reference voltage Vref. In some embodiments, the input supply to LDO 201/101 is VccFLL which may be a regulated supply and/or an always-on (AON) power supply. An AON power supply is one which is providing power to one or more circuits while other power supplies may be off. In some embodiments, transistor MP is a p-type transistor coupled to VccFLL and VccOSC power supply rails. In some embodiments, the output VccOSC is regulated by the feedback loop from VccOSC, Vfb, to out. In some embodiments, VccOSC power supply level is adjusted by adjusting resistance of resistors R3 and R4 by VrefTrim. In some embodiments, the resistors R1, R2, R3, and R4 are implemented as transistors operating in the linear region. In some embodiments, the resistors R1, R2, R3, and R4 are discrete resistors, where their resistance can be adjusted by switchably adding or subtracting resistors using transistors.

In some embodiments, one or more circuitries 202 comprises oscillator (OSC) 202a and frequency comparator and/or filter 202b. In some embodiments, frequency of the OSC 202a is determined by counting positive and negative edges of the output of the delay stages of OSC 202a. The aggregated count output is then filtered and compared against a target or desirable frequency by circuitry 202b to generate a VrefTrim code to adjust the resistance of R3 and/or R4. As such, the voltage level and current drive of VccOSC is adjusted to achieve faster frequency lock for OSC 202a.

Figure 3A:
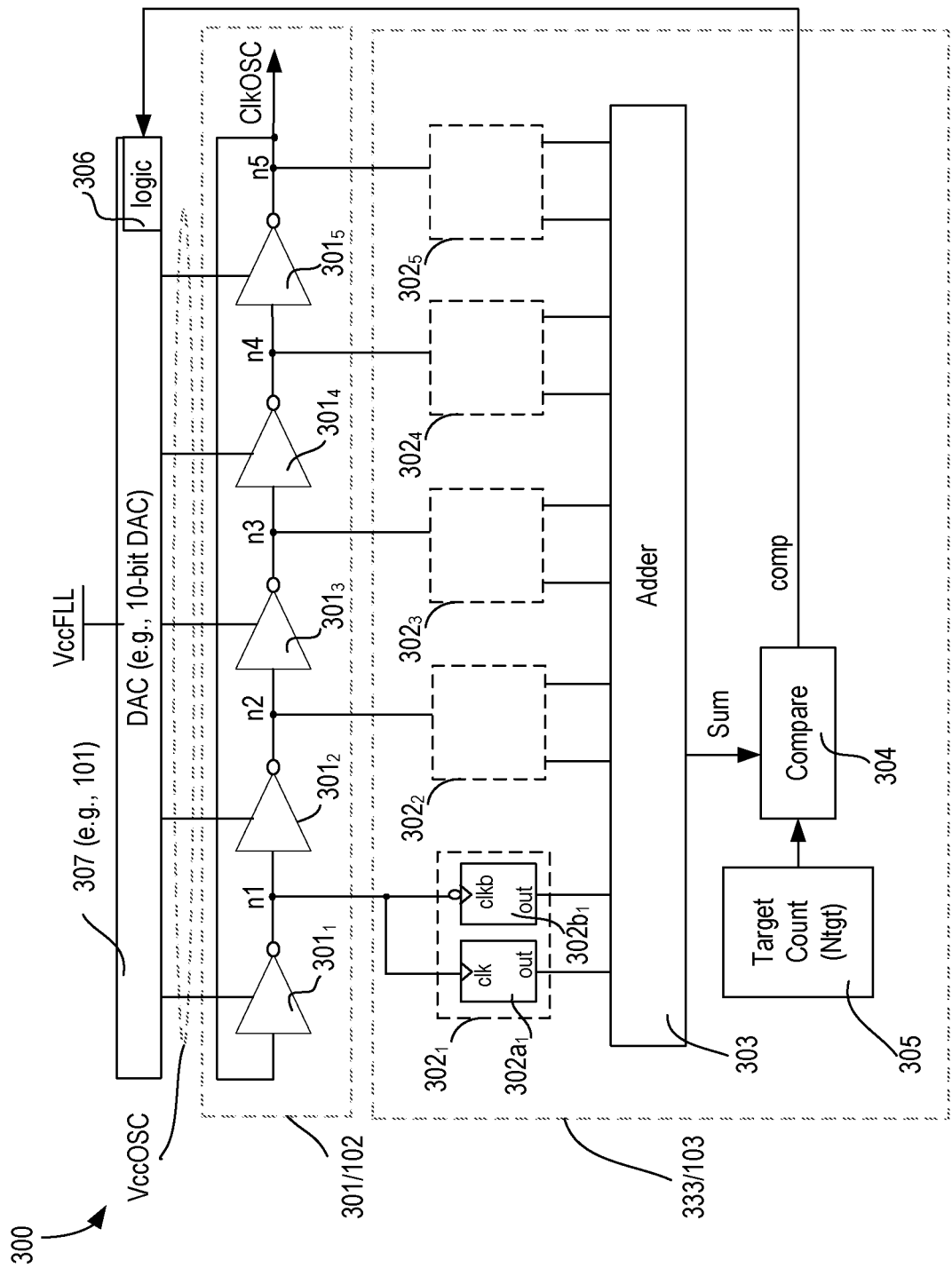
FIG. 3A illustrates an apparatus with a digital-to-analog converter (DAC) for adjusting supply to the oscillator of the FLL to improve lock time of the FLL, according to some embodiments of the disclosure.

FIG. 3A illustrates apparatus 300 with a digital-to-analog converter (DAC) for adjusting supply to the oscillator of the FLL to improve lock time of the FLL, according to some embodiments of the disclosure. In some embodiments, apparatus 300 comprises oscillator 301, logic 333, and DAC 307. In some embodiments, oscillator 301 is a 5-stage ring oscillator 301/101 which includes delay stages $301_{1-5}$; and dual sets of counters $302_{1-5}$, where each dual set of counters is coupled to an output of a delay stage. While the various embodiments are described with reference to five stage oscillator, any number of delay stages can be coupled together in a ring format to form an oscillator. Here the 5-stages are five inverting circuitries (also referred to as stages) $301_{1-5}$ such that the output n1 of stage $301_1$ is coupled to the input of stage $301_2$, the output n2 of stage $301_2$ is coupled to the input of stage $301_3$, the output n3 of stage $301_3$ is coupled to the input of stage $301_4$, the output n4 of stage $301_4$ is coupled to the input of stage $301_5$, and the output n5 (which provides the oscillator clock ClkOSC) is coupled to the input of stage $301_1$.

In some embodiments, each dual set of counters comprises a first counter to count the positive edge at the output of a delay stage, and a second counter to count the negative edge of the delay stage. With reference to dual set of counters $302_1$, the first counter is $302_{a1}$ with its clock (clk) input coupled to node n1, and the second counter $302_{b1}$ with its clock_bar clkb (e.g., inverse of clock input) is coupled to node n1. The outputs of each counter from each set is added by adder 303. In some embodiments, adder 303 is a carry save adder. Any suitable implementation of an adder may be used for adder 303. In some embodiments, the output of adder 303 is an aggregate sum which is compared by comparator 304. The inputs to comparator 304 are a predetermined or programmable target count Ntgt stored in memory 305 (e.g., non-volatile memory) and the aggregated sum. The output "comp" of comparator 304 indicates whether the aggregate sum is greater than, equal to, or less than the predetermined or programmable target count Ntgt. In some embodiments, the output "comp" is then decoded or encoded by logic 306 into a thermometer (or another encoded) code to turn on/off switches of DAC 307. In this example, the DAC is a 10-bit DAC. However, depending on the voltage sensitivity of the output frequency of ClkOSC, the resolution of DAC 307 can be fewer or more than 10 bits.

In various embodiments, due to the phase separation between the different taps n1, n2, n3, n4, and, n5, merely one of the counters may be exposed to metastability when frequency calibration (for fast lock of frequency) is enabled. In some embodiments, the counters 301a1 and 302ba, for example, are Gray code counters that endure the exposed metastability translated to an error of +/−1 in the count of a single counter or an effective error of +/−0.1 in the aggregate sum (e.g., sum of all 10 counters for the 5-stage ring oscillator). In some embodiments, once the FLL's calibration is complete, and frequency is within the desired tolerance, all but one of the counters may be disabled to save power (e.g., merely one counter is enabled after calibration) and to account for temperature drift.

Table 1 shows the clock frequency, corresponding cycle time, number of reference clocks for which the Gray code counters are counting (e.g., accumulation window), the expected or ideal count, minimum number of bits needed in each counter, the aggregate sum including the potential error due to metastability, and the frequency accuracy in percentage. Here, the reference clock frequency is assumed to be 100 MHz.

TABLE 1

| Frequency | Tcy | Acc. Window (e.g., no. of Ref clocks) | Idea count per counter (e.g., Ntgt) | No. of bits per counter | Aggregate sum | Accuracy |
|---|---|---|---|---|---|---|
| 500 MHz | 2 ns | 1 | 5 | 3 | 4.9/5.1 | 2% |
|  | 2 ns | 8 | 40 | 6 | 39.9/40.1 | 0.25% |
| 1 GHz | 1 ns | 1 | 10 | 4 | 9.9/10.1 | 1% |
|  | 1 ns | 2 | 20 | 5 | 19.9/20.1 | 0.5% |
|  | 1 ns | 8 | 80 | 7 | 79.9/80.1 | 0.125% |
| 5 GHz | 200 ps | 1 | 50 | 6 | 49.9/50.1 | 0.2% |
|  | 200 ps | 8 | 400 | 9 | 399.9/400.1 | 0.025% |

Assuming a simple binary search with a 10-bit DAC (e.g., 1 mV resolution), and assuming two reference clocks (RefClks) for enabling the Gray code counters (accumulation window) plus one to two RefClks for computing the aggregate sum and effective VccOSC adjustment, the calibration time for 0.1% accuracy at 5 GHz or 0.5% accuracy at 1 GHz is merely 300 ns to 400 ns. The frequency accuracy and lock time is well below that of any existing FLL or the coarse calibration time of any digital DLL or PLL.

Figure 3B:
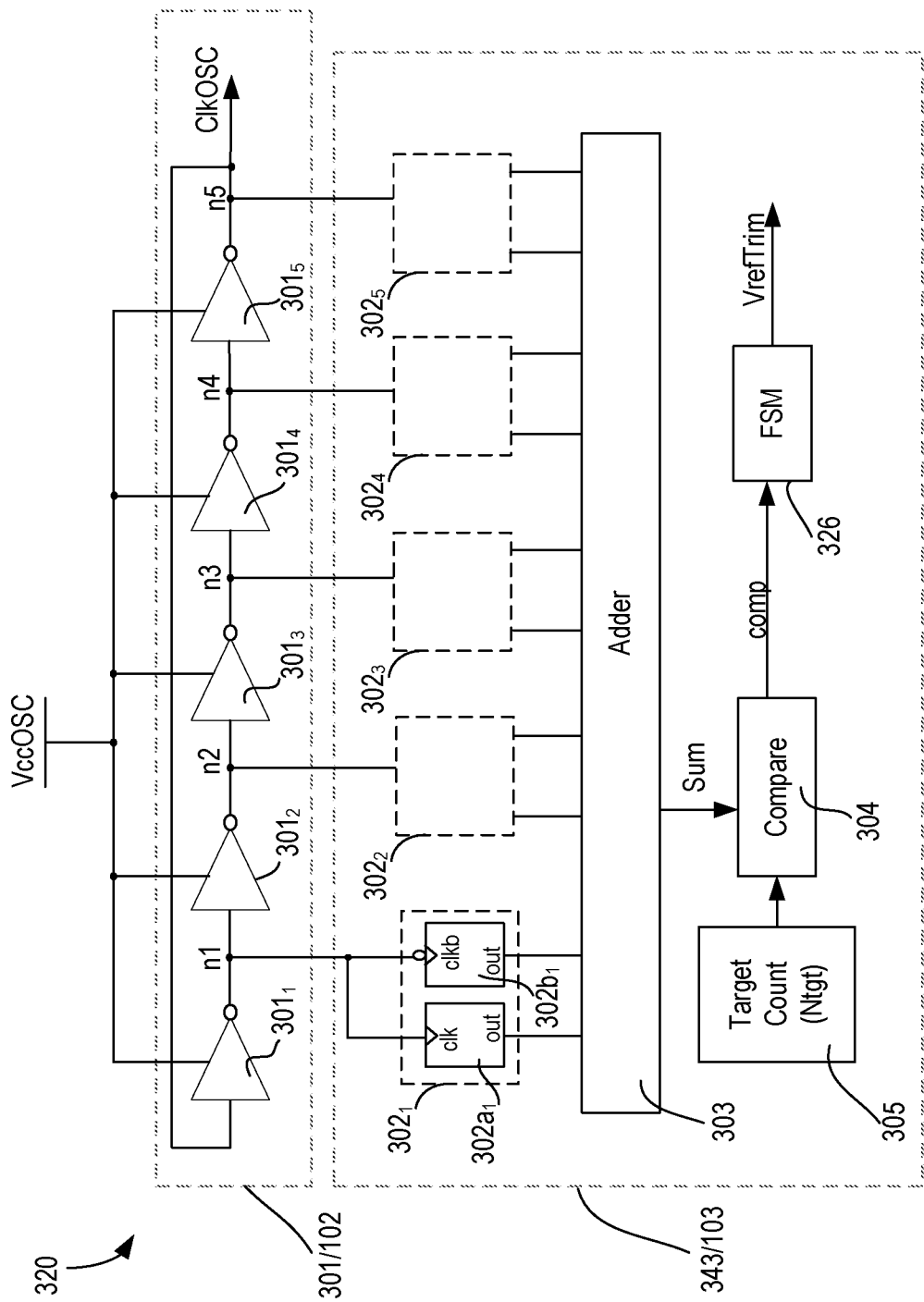
FIG. 3B illustrates an apparatus having a finite state machine for adjusting supply to the oscillator of the FLL to improve lock time of the FLL, according to some embodiments of the disclosure.

FIG. 3B illustrates apparatus 320 having a finite state machine for adjusting supply to the oscillator of the FLL to improve lock time of the FLL, according to some embodiments of the disclosure. In some embodiments, apparatus 320 comprises oscillator 301 and logic 343. In this example, DAC 307 is removed and VccOSC is adjusted using VrefTrim code. Compared to logic 333, where logic 343 comprises a finite state machine 326 which receives the output "comp" from comparator 304 and generates a multi-bit VrefTrim code. The VrefTrim code is then used to adjust the resistance of resistive devices R3 and/or R4 to adjust the voltage and/or current supply of VccOSC supply rail. The resistive devices R3 and/or R4 can be discrete resistors or active devices. Apparatus 320 is an alternative to apparatus 300. However, in some embodiments, elements of apparatus 320 and apparatus 300 may be combined to provide multiple ways to adjust VccOSC. For example, VccOSC can be adjusted using DAC 307 and/or VrefTrim.

Figure 4:
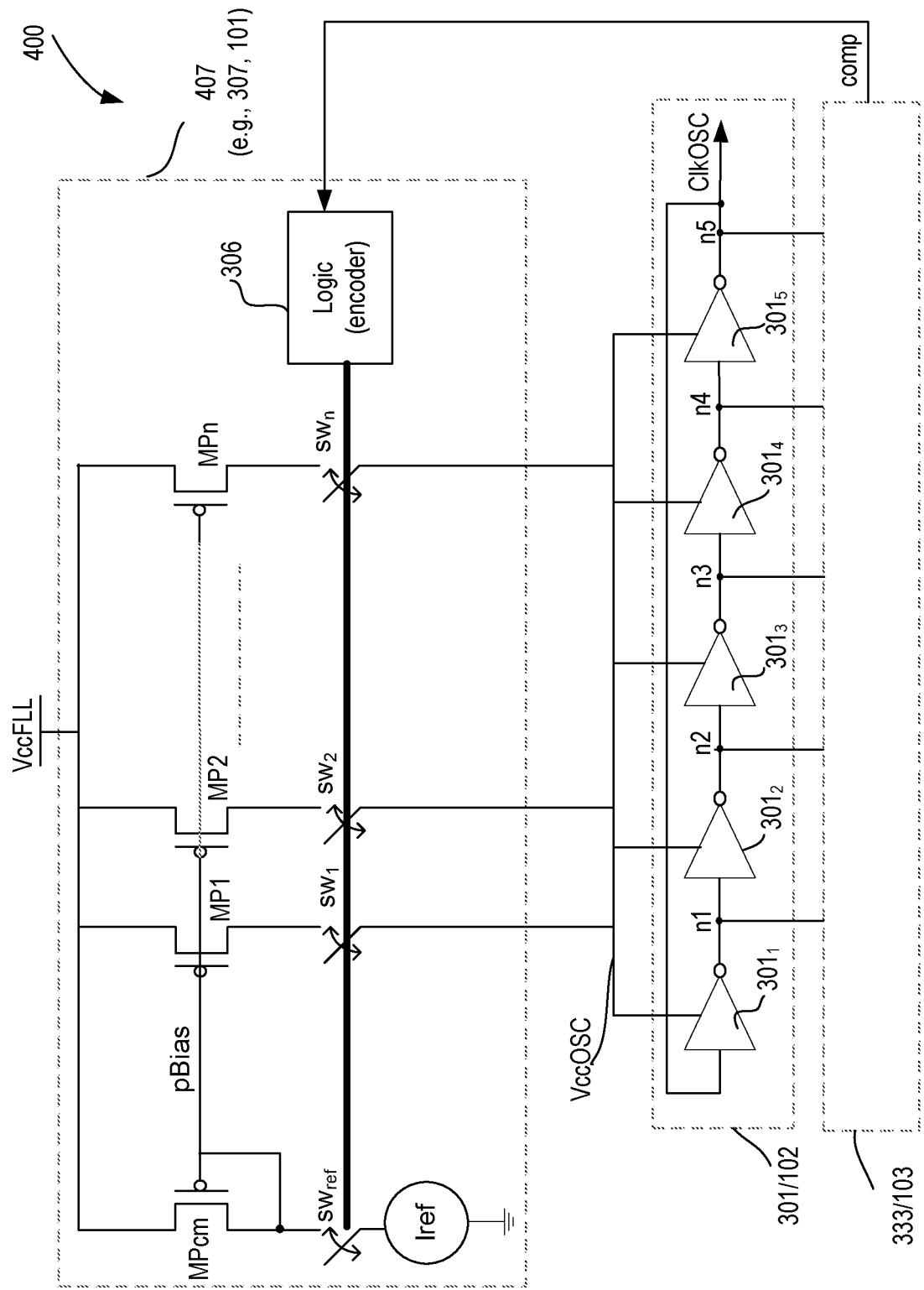
FIG. 4 illustrates an apparatus including a current mirror based DAC for controlling the supply of the oscillator of the FLL to improve lock time of the FLL, according to some embodiments of the disclosure.

FIG. 4 illustrates apparatus 400 comprising a current mirror based DAC 407 (e.g., DAC 307 for supply generator 101) for controlling the supply of the oscillator of the FLL to improve lock time of the FLL, according to some embodiments of the disclosure. In some embodiments, DAC 407 comprises a reference current source Iref, diode-connected device MPcm (which forms the basis of the current mirror) to provide bias pBias to devices Mp1, MP2, through MPn. Here, the devices are p-type devices coupled to VccFLL supply rail. In some embodiments, current path through each device of the DAC is controlled by a switch (e.g., a transistor passed pass gate or a transmission gate). The switches are $SW_{ref}$, $SW_1$ though $SW_n$. In some embodiments, the comparator output "comp" is decoded or encoded into a multi-bit code (e.g., a thermometer code) by logic 306 to turn on/off the switches.

Figure 5:
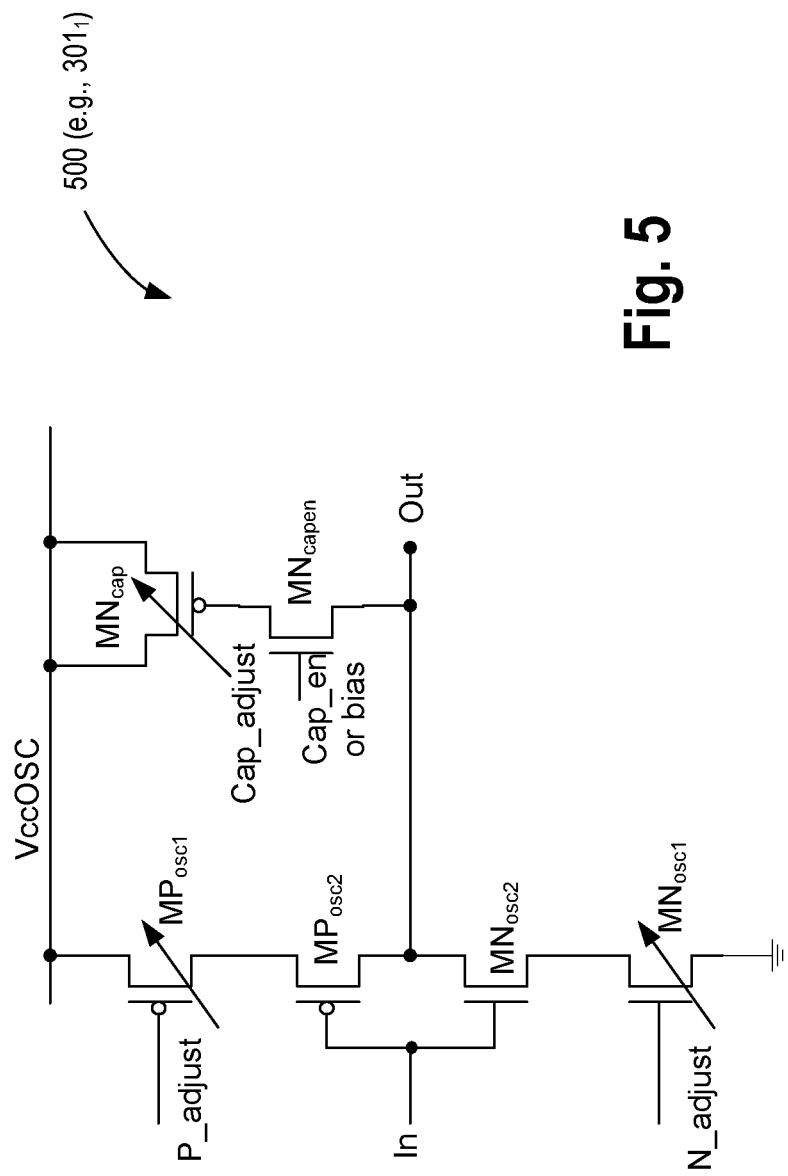
FIG. 5 illustrates a delay stage of the oscillator with tunability, according to some embodiments of the disclosure.

FIG. 5 illustrates a delay stage 500 (e.g., $301_1$) of the oscillator 301 with tunability, according to some embodiments of the disclosure. In some embodiments, delay stage 500 comprises p-type transistors $MP_{osc1}$ and $MP_{osc2}$, n-type transistors $MN_{osc1}$, $MN_{osc2}$, $MN_{capen}$, and $MN_{cap}$. Delay stage 500 is an inverting stage where the output "Out" is an inverse of the input "In". The propagation delay of delay stage 500 can by adjusted digitally by enabling or disabling transistors $MP_{osc1}$, $MN_{osc1}$, and $MN_{cap}$. In this example, drive strength of $MP_{osc1}$ is adjusted by P_adjust, drive strength of $MN_{osc1}$ is adjusted by N_adjust, and capacitance of $MN_{cap}$ is adjusted b Cap_adjust, where P_adjust, N_adjust, and/or Cap_adjust may be generated by a filter (not shown) of the FLL. In some embodiments, the additional capacitance on node Out is provided by $MN_{cap}$ via transistor $MN_{capen}$. In some embodiments, $MN_{cap}$ is enabled (e.g., turned on) by Cap_en. In some embodiments, Cap_en is a bias voltage to bias $MN_{capen}$ to achieve a certain capacitance from $MN_{cap}$ on node Out.

Figure 6:
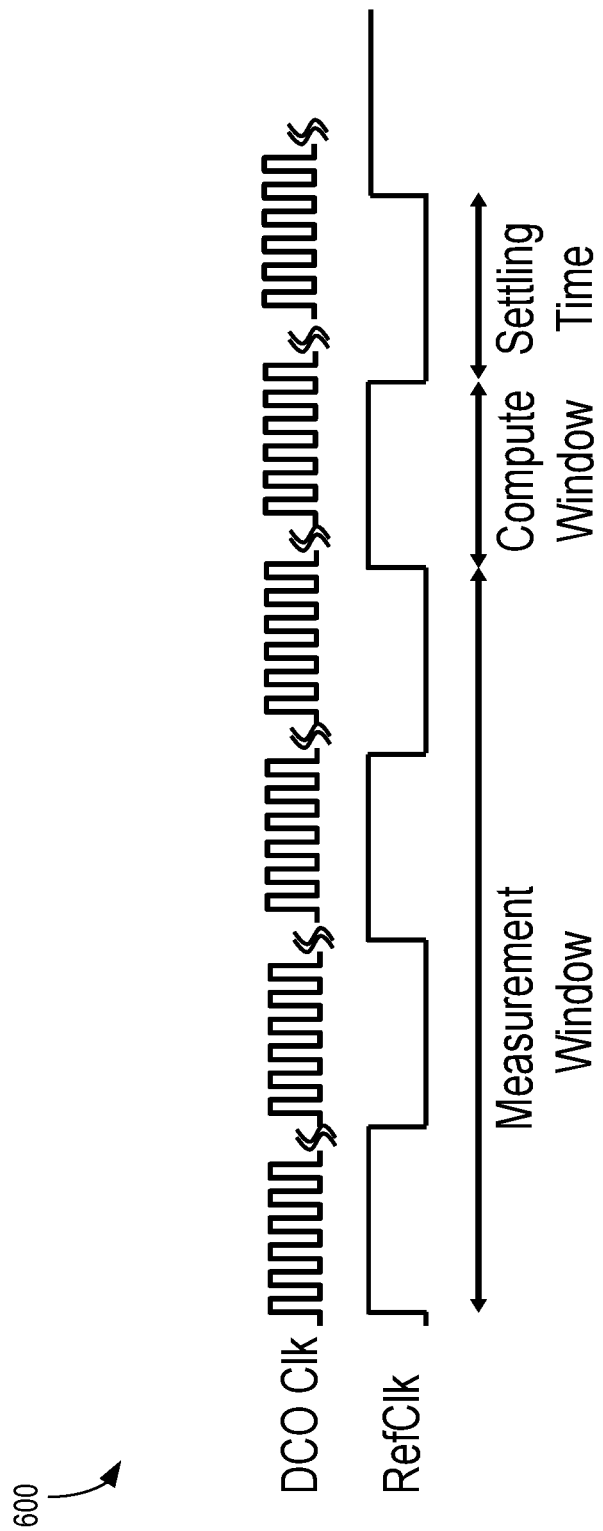
FIG. 6 illustrates a high level micro-architecture of the FLL locking scheme using a timing diagram, in accordance with some embodiments of the disclosure.

FIG. 6 illustrates a high level micro-architecture 600 of the FLL locking scheme using a timing diagram, in accordance with some embodiments of the disclosure. Here, DCO clock (DCO Clk) is the oscillator clock ClkOSC (or clock of FIG. 1), and RefClk is the reference clock to the frequency detector (not shown) of the FLL.

During the Measurement Window, the frequency of ClkOSC is determined by the Gray code counters (e.g., counters in $301_{1-5}$) that count rising and falling edges at the outputs of each delay stage. The frequency of ClkOSC is controlled by adjusting the DCO tail current through the current DAC 307. For example, an 11-bit current DAC provides less than 3.2 MHz step size (e.g., less than 0.1% at 3.2 GHz and 0.3% at 1.0 GHz). In some embodiments, logic 306 applies binary search to determine the code for the current DAC for a target or desired frequency Ntgt.

During the Compute Window, the aggregate sum from the 10 Gray code counters is computed by adder 303, and then compared to a target count Ntgt to determine the new value of VrefTrim. During the Settling Time, the VccOSC supply is allowed to settle or stabilize, and this settling time is proportional to the settling time of the current DAC 307. In this example, the convergence time is 3 RefClks per bit times 11 bits to equal 33 RefClks, where 33 RefClks amounts to 330 ns at 100 MHz RefClk.

Figure 8:
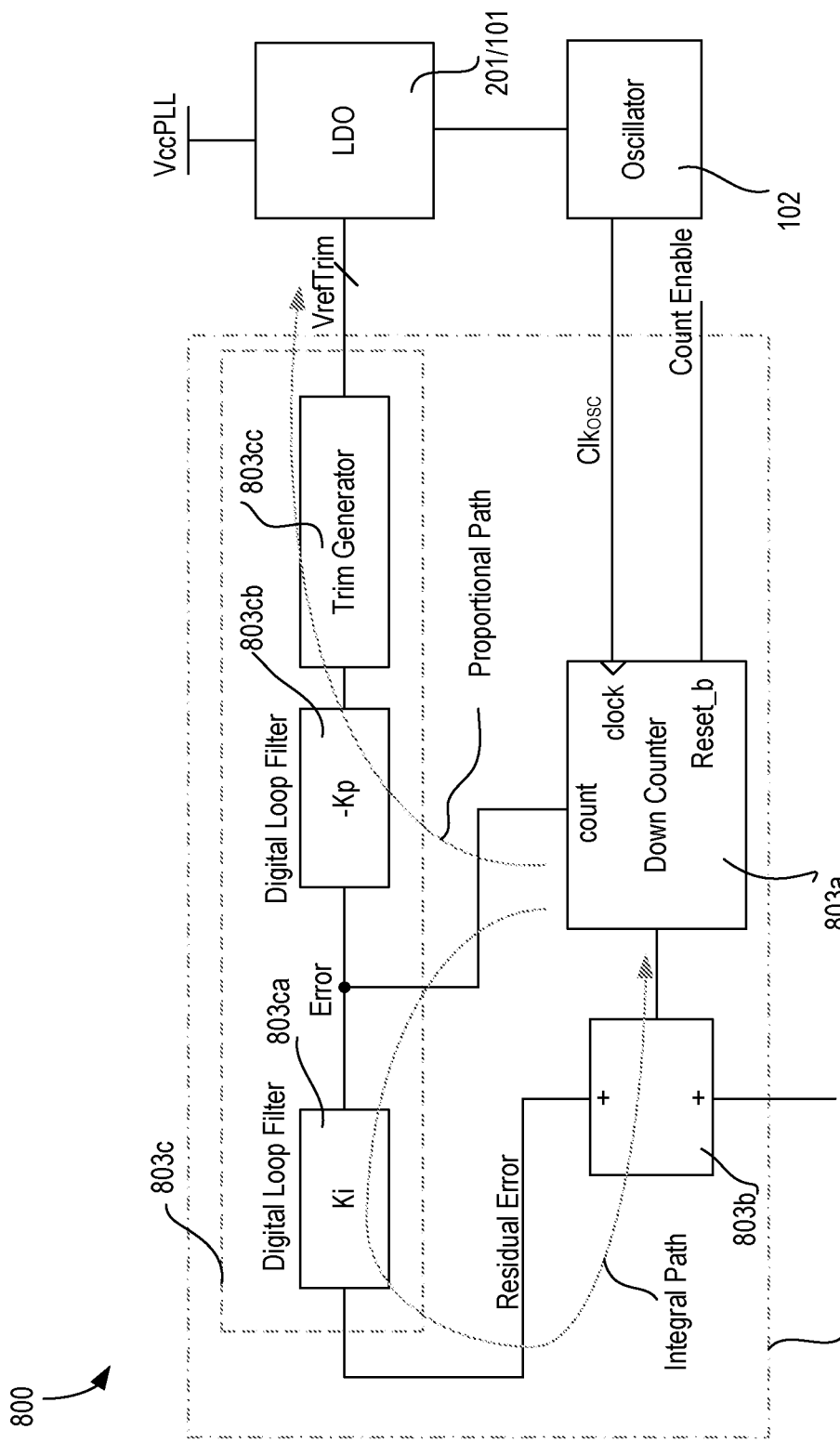
FIG. 8 illustrates an apparatus to achieve substantially zero or zero average frequency error while improving lock time of the FLL, in accordance with some embodiments.

FIG. 8 illustrates apparatus 800 to achieve substantially zero or zero average frequency error while improving lock time of the FLL, in accordance with some embodiments. Apparatus 800 comprises LDO or supply generator 201/101, Oscillator 102, logic 803/103. In some embodiments, logic 803/103 comprises a down counter 803a, a summer 803b, and filter and trim generating circuitries 803c. In some embodiments, the filter and trim generating circuitries 803c comprises digital loop filters Ki 803ca and –Kp 803cb, and Trim Generator 803cc. Here, Ntgt can be user programmable, count enable is the accumulation window size (see Table 1, e.g., 8 reference clock cycles for 5 GHz frequency), $Clk_{OSC}$ is the output of oscillator 102 which is used to count down from the previous count value which includes the error. In some embodiments, the Residual Error is generated by summer 803b which adds an error amount to the target or desired frequency count. Here, summer 803b is akin to a phase frequency detector which generates small error steps to cause LDO 201/101 to adjust VccOSC in small steps by adjusting VrefTrim.

In some embodiments, frequency error can be completely eliminated by apparatus 800 by keeping track of the residual error from the last computation. In some embodiments, the proportional path adjusts the reference voltage used by LDO 201/101 to effect a frequency change in oscillator 102. In some embodiments, the integral path keeps track of the accumulated error instead of clearing it out before each cycle as implemented in state of the art FLLs. This helps ensure that the average frequency does not have a residual error.

For instance, if the target count is 1000, and the down counter counted 984 edges during the compute window, the Error would be 16. This error is scaled by the Digital Loop Filter by Ki 803ca for the integral path and by Kp 803cb for the proportional path. In some embodiments, Ki may be ⅛ and Kp may be ½. However, other embodiments may have other values for Ki and Kp. Continuing with the example where Ki is ⅛ and Kp is ½, a residual error of 2 (e.g., 16 right-shifted by 3 places to retain the quotient of 16 divided by $2^3$) for the integral path is achieved which is then added to the target count of 1000 to produce a total of 1002 as the starting value for the down counter in the next compute window. The proportional path divides the Error by 2 to generate 8 which is used by the Trim Generator 803cc to adjust the VrefTrim codes quickly. Preserving a fraction of the error through the proportional and integral paths allows the system to respond relatively quickly to large error (proportional path) while retaining memory of the overall error in the system (integral path) to eliminate or nearly eliminate any long-term average error in frequency.

Figure 9:
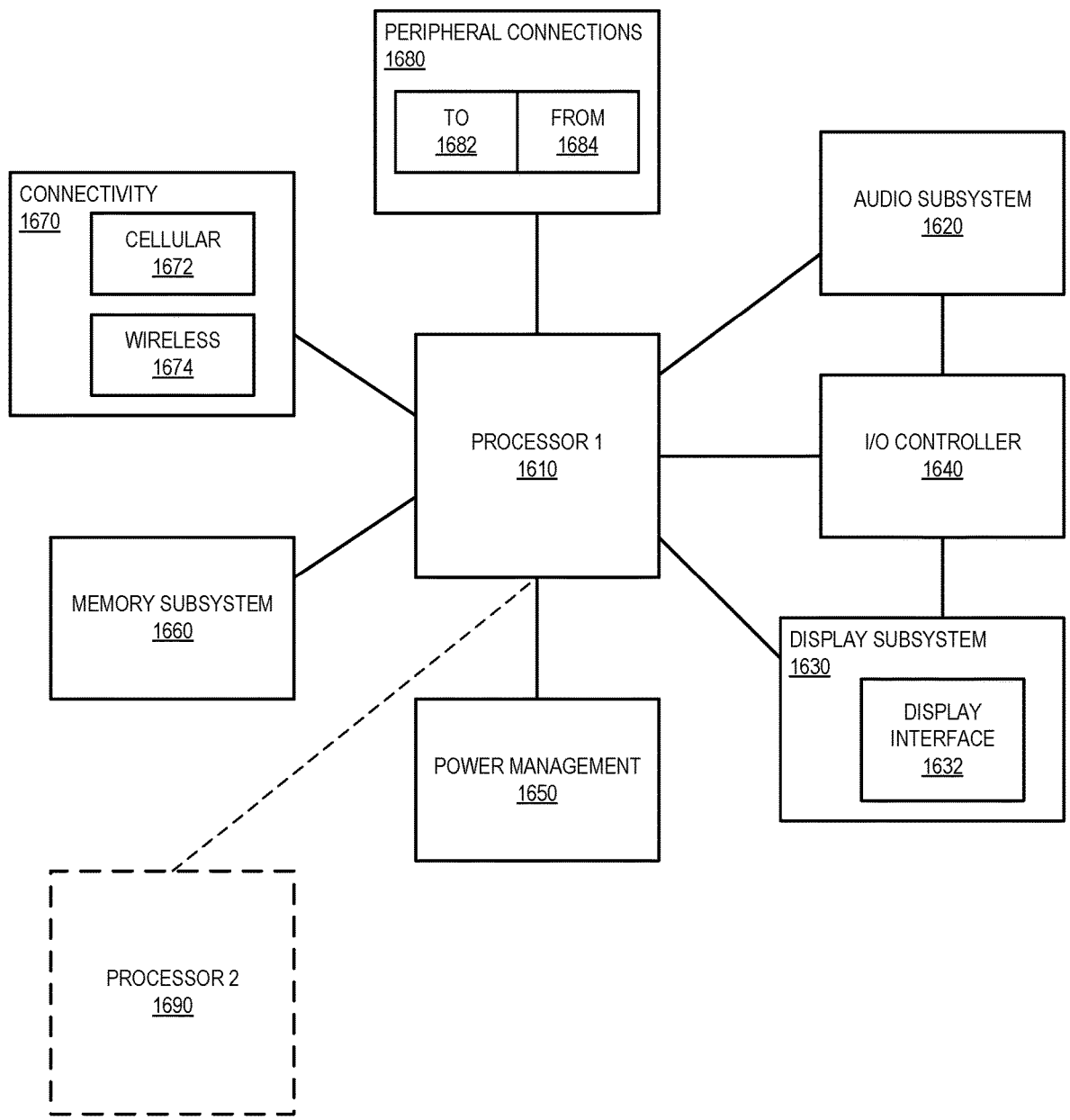
FIG. 9 illustrates a smart device or a computer system or a SoC (System-on-Chip) having an apparatus to improve lock time of a FLL, according to some embodiments of the disclosure.

FIG. 9 illustrates a smart device or a computer system or a SoC (System-on-Chip) having an apparatus to improve lock time of a FLL, according to some embodiments of the disclosure. FIG. 9 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 having an apparatus to improve lock time of a FLL, according to some embodiments discussed. Other blocks of the computing device 1600 may also include an apparatus to improve lock time of a FLL, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600 or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
    a ring oscillator comprising delay stages including a first delay stage and a second delay stage, wherein the ring oscillator is coupled to a power supply rail; and
    a plurality of counters including a first set of counters and a second set of counters, wherein the first set of counters is coupled to the first delay stage, wherein the second set of counters is coupled to the second delay stage, and wherein an individual first and second set of counters includes two counters, each of the two counters has a complementary clock input relative to another.

2. The apparatus of claim 1, wherein the first or second set of counters includes:
    a first counter having a clock input coupled to an output of the first delay stage; and
    a second counter having an inverse clock input coupled to the output of the first delay stage.

3. The apparatus of claim 2, wherein the first and second counters comprise first and second Gray code counters, respectively.

4. The apparatus of claim 1 comprises an adder coupled to outputs of the first and second sets of counters.

5. The apparatus of claim 4, wherein the adder comprises a carry-save adder.

6. The apparatus of claim 4 comprises a comparator to compare an output of the adder with a threshold number.

7. The apparatus of claim 6 comprises a finite state machine to receive an output of the comparator.

8. The apparatus of claim 6, wherein the threshold number corresponds to a desired frequency of a frequency locked loop.

9. The apparatus of claim 1, wherein the power supply rail is coupled to a low dropout (LDO) regulator.

10. The apparatus of claim 9 comprises one or more circuitries to receive an output of the ring oscillator and to adjust a threshold voltage of a comparator of the LDO regulator according to the output of the ring oscillator and a desired frequency of a frequency locked loop.

11. The apparatus of claim 10, wherein the one or more circuitries comprises a counter having a clock input and a reset input, wherein the clock input is coupled to the output of the ring oscillator, and wherein the reset input is coupled to a programmable input.

12. The apparatus of claim 11, wherein the one or more circuitries comprises a summer coupled to the counter, wherein the summer is to receive a desired frequency of a frequency locked loop and to add an error quantity associated with a current frequency of the ring oscillator.

13. The apparatus of claim 1, wherein the power supply rail is coupled to a digital-to-analog converter (DAC).

14. An apparatus comprising:
a frequency locked loop (FLL) comprising an oscillator including a plurality of delay stages, wherein an output of each delay stage is counted to determine a frequency of the FLL; and
one or more circuitries coupled to the FLL to adjust a power supply to the FLL according to the determined frequency of the FLL, wherein the one or more circuitries comprises a summer coupled to a counter, and wherein the summer is to receive a desired frequency of the FLL and to add an error quantity associated with a current frequency of the oscillator.

15. The apparatus of claim 14 comprises a finite state machine to control the one or more circuitries.

16. The apparatus of claim 14, wherein the one or more circuitries include a trimable low dropout (LDO) regulator which is coupled to a power supply rail to provide the power supply to the FLL.

17. The apparatus of claim 14, wherein the one or more circuitries include a trimable digital-to-analog converter (DAC) which is coupled to a power supply rail to provide the power supply to the FLL.

18. A system comprising:
a memory;
a processor coupled to the memory, wherein the processor includes:
a frequency locked loop (FLL) comprising an oscillator including a plurality of delay stages, wherein an output of each delay stage is counted to determine a frequency of the FLL; and
one or more circuitries coupled to the FLL to adjust a power supply to the FLL according to the determined frequency of the FLL, wherein the one or more circuitries comprise a counter having a clock input and a reset input, wherein the clock input is coupled to an output of the oscillator, and wherein the reset input is coupled to a programmable input; and
a wireless interface to allow the processor to communicate with another device.

19. The system of claim 18, wherein the processor comprises a finite state machine to control the one or more circuitries.

20. The system of claim 19, wherein:
the one or more circuitries include a trimable low dropout (LDO) regulator which is coupled to a power supply rail to provide the power supply to the FLL; or
the one or more circuitries include a trimable digital-to-analog converter (DAC) which is coupled to a power supply rail to provide the power supply to the FLL; and
wherein:
the one or more circuitries comprises a summer coupled to the counter, wherein the summer is to receive a desired frequency of the FLL and to add an error quantity associated with a current frequency of the oscillator.

21. An apparatus comprising:
a ring oscillator comprising delay stages including a first delay stage and a second delay stage, wherein the ring oscillator is coupled to a power supply rail; and
a plurality of counters including a first set of counters and a second set of counters, wherein the first set of counters is coupled to the first delay stage, and wherein the second set of counters is coupled to the second delay stage, wherein the first or second set of counters includes:
a first counter having a clock input coupled to an output of the first delay stage; and
a second counter having an inverse clock input coupled to the output of the first delay stage.

22. The apparatus of claim 21, wherein the first and second counters comprise first and second Gray code counters, respectively.

23. The apparatus of claim 21, wherein the power supply rail is coupled to a low dropout (LDO) regulator.

24. An apparatus comprising:
a ring oscillator comprising delay stages including a first delay stage and a second delay stage, wherein the ring oscillator is coupled to a power supply rail;
a plurality of counters including a first set of counters and a second set of counters, wherein the first set of counters is coupled to the first delay stage, and wherein the second set of counters is coupled to the second delay stage;
an adder coupled to outputs of the first and second sets of counters; and
a comparator to compare an output of the adder with a threshold.

25. The apparatus of claim 24 comprises a finite state machine to receive an output of the comparator.

26. The apparatus of claim 24, wherein the threshold corresponds to a desired frequency of a frequency locked loop.

* * * * *